US006711733B2

United States Patent
Noda (10) Patent No.: US 6,711,733 B2
(45) Date of Patent: Mar. 23, 2004

(54) SYSTEM FOR AND METHOD OF EVALUATING MASK PATTERNS

(75) Inventor: Tomonobu Noda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/226,206

(22) Filed: Aug. 23, 2002

(65) Prior Publication Data

US 2003/0056184 A1 Mar. 20, 2003

(30) Foreign Application Priority Data

Aug. 23, 2001 (JP) ........................................ 2001-253110

(51) Int. Cl.$^7$ .............................................. G06F 17/50
(52) U.S. Cl. ................................ 716/19; 716/5; 716/21; 382/141; 382/144; 382/145; 356/237.4; 356/237.5
(58) Field of Search ........................ 716/1–21; 324/765; 382/141, 144, 145; 356/237.2–237.5

(56) References Cited

U.S. PATENT DOCUMENTS

| | | | |
|---|---|---|---|
| 5,917,332 A | * 6/1999 | Chen et al. | ................. 324/765 |
| 2002/0035461 A1 | * 3/2002 | Chang et al. | ................. 703/13 |
| 2002/0057831 A1 | * 5/2002 | Hiroi et al. | ................. 382/149 |
| 2002/0181756 A1 | * 12/2002 | Shibuya et al. | ............. 382/145 |
| 2003/0058436 A1 | * 3/2003 | Ono et al. | ............... 356/237.2 |

OTHER PUBLICATIONS

Isomura et al., "An New Inspection Method for PSM on DUV Inspection Light Source," IEEE, Nov. 2, 2001, pp. 64–65.*
Akeno et al., "Particle Contamination Control Technology In Electron Beam Mask Writing System for Next–Generation Mask Fabrication," IEEE, Nov. 2, 2001, pp. 146–147.*
Charles H. Stapper, et al. "Integrated Circuit Yield Management and Yield Analysis: Development and Implementation" IEEE Transactions on Semiconductor Manufacturing, vol. 8, No. 2, May 1995, pp. 95–102.

* cited by examiner

*Primary Examiner*—Vuthe Siek
(74) *Attorney, Agent, or Firm*—Oblon, Spivak, McClelland, Maier & Neustadt, P.C.

(57) ABSTRACT

An aspect of the present invention provides a system for evaluating mask patterns, including a pattern image generator configured to generate a pattern image of mask patterns to be formed on a mask, a defect generator configured to receive defect data for particles and imaginarily generate defects on the mask according to the defect data, a pattern-defect image generator configured to generate a pattern-defect image of the mask by combining the generated pattern image with the generated defects, a pattern tester configured to determine whether or not each of the defects in the pattern-defect image is allowable according to pattern rules, and a ratio computation unit configured to compute at least one of an allowable ratio and an un allowable ratio according to a determination result from the pattern tester.

20 Claims, 8 Drawing Sheets

SYSTEM FOR AND METHOD OF EVALUATING MASK PATTERNS

CROSS REFERENCE TO RELATED APPLICATIONS

This application claims benefit of priority under 35 USC 119 based on Japanese Patent Application No. P2001-253110 filed on Aug. 23, 2001, the entire contents of which are incorporated by reference herein.

BACKGROUND OF THE INVENTION

1. Field of the Invention

The present invention relates to a system for and a method of evaluating mask patterns formed on a mask, and particularly, to a technique of correctly evaluating mask patterns formed on a mask.

2. Description of the Related Art

Semiconductor device manufacturing processes involve transferring designed patterns onto a wafer through a mask or reticle. The word "mask" in the following explanation includes both for the mask and reticle. When patterning a mask in a clean room, particles floating in the clean room may adhere to the mask to spoil the patterns formed on the mask. To avoid the problem, the patterns on the mask must be evaluated.

Figure 1:
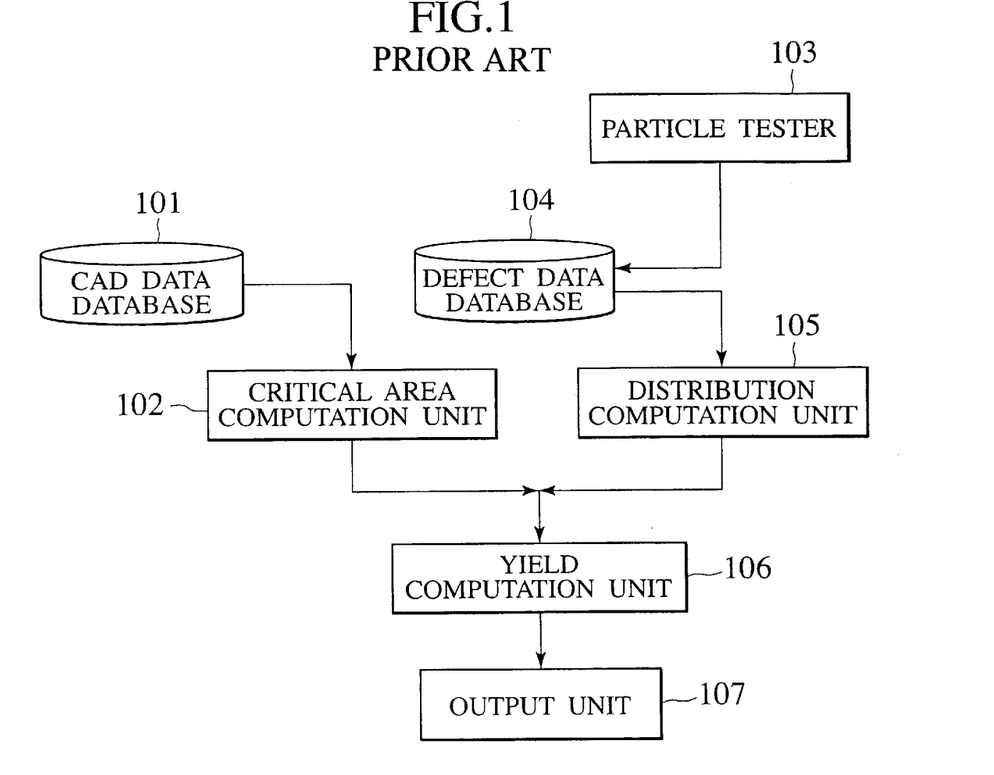
FIG. 1 is a block diagram showing a system for evaluating mask patterns according to a related art.

FIG. 1 is a block diagram showing a system for evaluating mask patterns according to a related art. A CAD data database 101 stores CAD data for semiconductor products to be formed with the use of masks. Data related to a mask is loaded from the CAD data database 101 to a critical area computation unit 102, which computes each area on the mask where a particle of a given size causes a killer defect. A particle tester 103 tests a mask forming process and provides defect data, which is stored in a defect data database. According to the defect data, a distribution computation unit 105 computes a particle size distribution. A yield computation unit 106 computes a yield as follows:

$$Y = exp(-\lambda) \quad (1)$$

where Y is the yield and $\lambda$ is a killer defect that is expressed as follows:

$$\lambda = \int_{Rmin}^{Rmax} Ac(R) \cdot D(R) dR \quad (2)$$

where Ac(R) is a critical area, D(R) is a particle size distribution, Rmax is a maximum particle size, and Rmin is a minimum particle size.

The computed yield is output from an output unit 107. According to the output, the patterns on the mask are evaluated. This related art includes all defective patterns in the yield computation, and therefore, tends to provide a severer result than an actual condition.

SUMMARY OF THE INVENTION

An aspect of the present invention provides a system for evaluating mask patterns, including a pattern image generator configured to generate a pattern image of mask patterns to be formed on a mask, a defect generator configured to receive defect data for particles and imaginarily generate defects on the mask according to the defect data, a pattern-defect image generator configured to generate a pattern-defect image of the mask by combining the generated pattern image with the generated defects, a pattern tester configured to determine whether or not each of the defects in the pattern-defect image is allowable according to pattern rules, and a ratio computation unit configured to compute at least one of an allowable ratio and an un allowable ratio according to a determination result from the pattern tester.

Another aspect of the present invention provides a method of evaluating mask patterns, including, generating a pattern image of mask patterns to be formed on a mask, receiving data for particles, imaginarily generating defects on the mask according to the received data, and generating a pattern-defect image of the mask by combining the generated pattern image with the generated defects, determining whether or not each of the defects in the pattern-defect image is allowable according to pattern rules, and computing, according to a result of the determination, at least one of an allowable ratio and an unallowable ratio.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

A system for evaluating mask patterns according to an embodiment of the present invention may be realized in a hardware structure. The hardware structure may be a computer system that includes input units such as a keyboard, a mouse, a light pen, and a flexible disk drive, external storage units such as memory devices and disk drives, and output units such as a display and a printer. The computer system may be a general-purpose computer, a workstation, or a personal computer. According to an embodiment of the present invention, a method for evaluating mask patterns may be realized in a computer program to be installed in and executed by a computer system.

Figure 2:
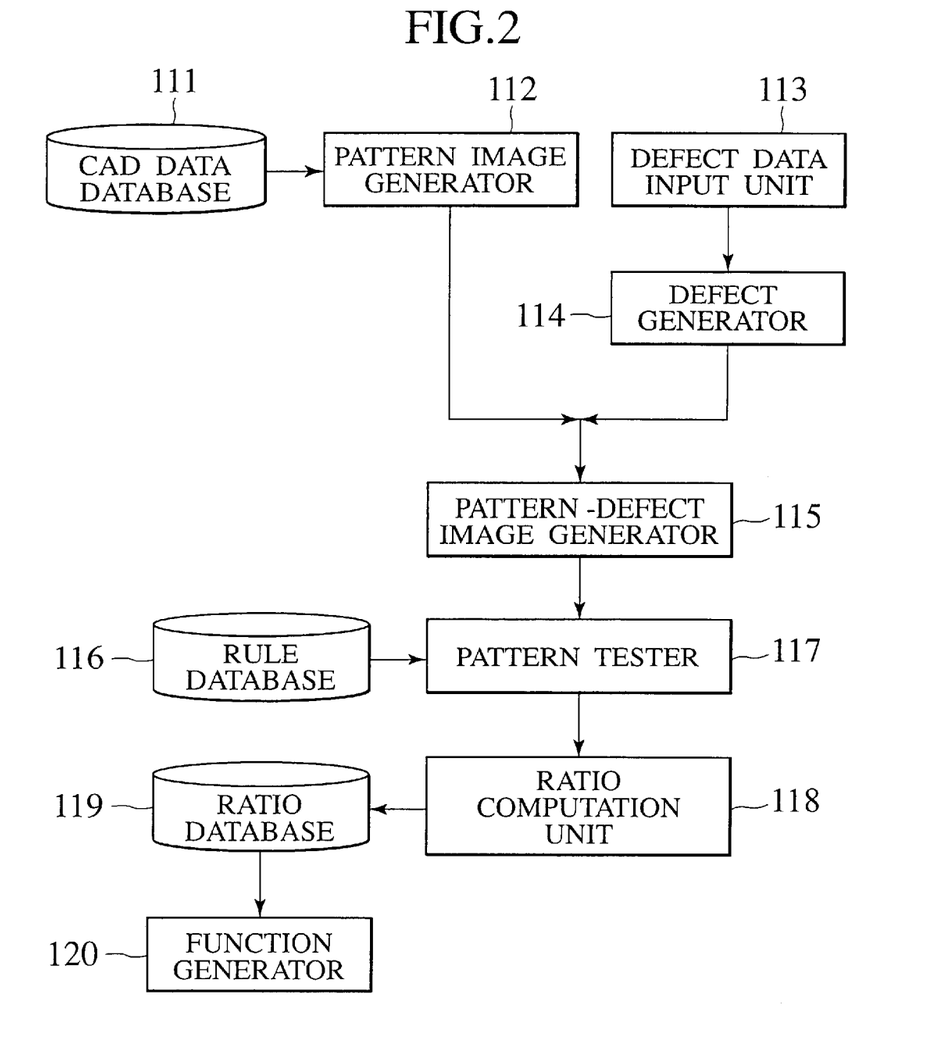
FIG. 2 is a block diagram showing a system for evaluating mask patterns according to an embodiment of the present invention.

FIG. 2 is a block diagram showing a system for evaluating mask patterns according to an embodiment of the present invention. A CAD data database 111 stores data for masks used to manufacture semiconductor products. Data for a mask to be evaluated is read out from the CAD data database 111 to a pattern image generator 112, which generates a pattern image of the mask, i.e., an image of patterns to be formed on the mask.

Figure 3:
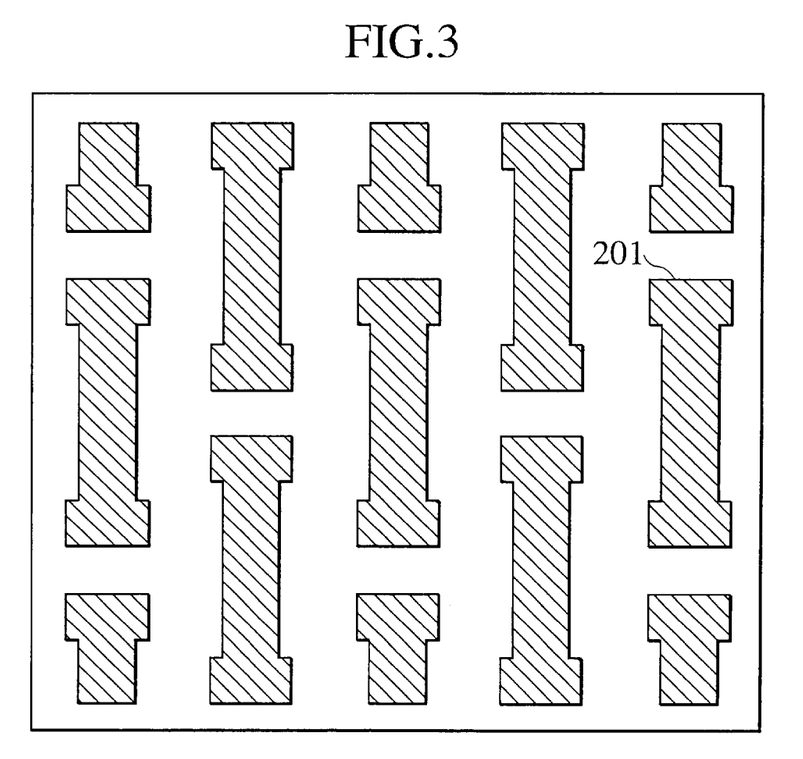
FIG. 3 shows an example of a pattern image prepared by a pattern image generator in the system of FIG. 2.

FIG. 3 shows an example of a pattern image generated by the pattern image generator 112. Suppose that the pattern image generator 112 generates the pattern image including patterns 201.

A defect data input unit 113 receives defect data such as the sizes and numbers of particles that may cause defects on the mask. The defect data may be entered by an operator when required, or may be prepared in advance and be read as and when needed. In addition to such data, other necessary parameters may be entered.

A defect generator 114 randomly and imaginarily generates defects on the mask according to the entered defect data. The defect generator 114 may employ Monte Carlo method to randomly determine the positions of defects on the mask.

Figure 4:
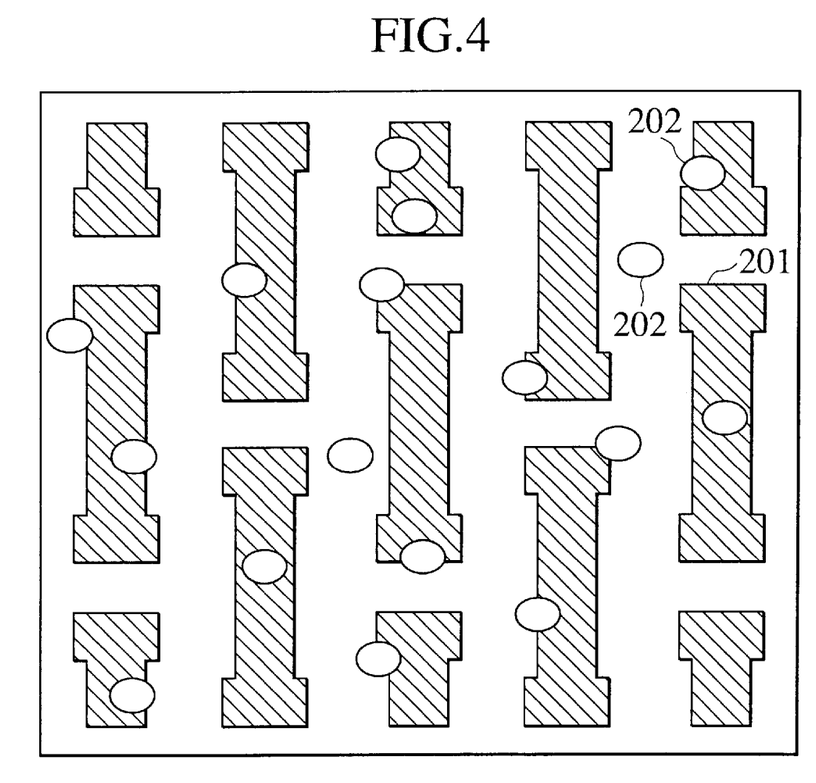
FIG. 4 shows an example of a pattern-defect image prepared by a pattern-defect image generator in the system of FIG. 2.

A pattern-defect image generator 115 combines the generated defects from the defect generator 114 with the generated pattern image from the pattern image generator 112, to provide a pattern-defect image of the mask, i.e., an image of the defects and patterns to be formed on the mask. This image may be generated by overlaying the generated defects on the pattern image according to the positions of the generated defects. FIG. A shows the pattern-defect image generated by the pattern-defect image generator 115 with the generated defects 202 overlapping the generated patterns 201.

A rule database 116 stores rules to classify defects. According to the rules, each of the generated defects is classified into an allowable defect, an unallowable defect, or an irrelevant defect.

Figure 5:
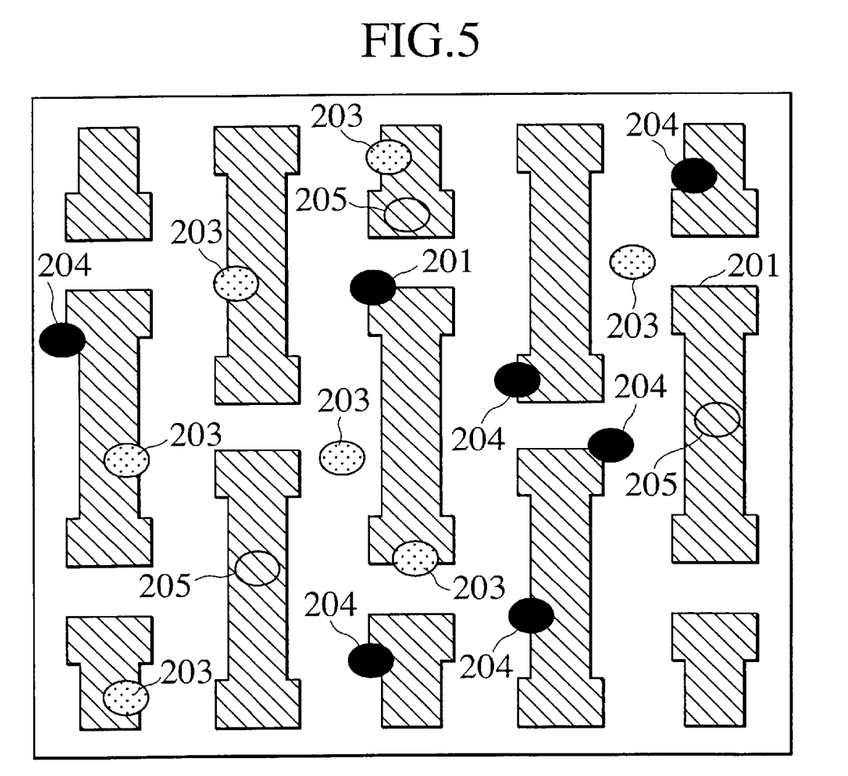
FIG. 5 shows defects classified by a pattern tester in the system of FIG. 2.

FIG. 5 shows the defects classified by a pattern tester 117 according to the rules. According to the embodiment, the generated defects are classified into allowable defects 203, unallowable defects 204, and irrelevant defects 205.

Figure 6:
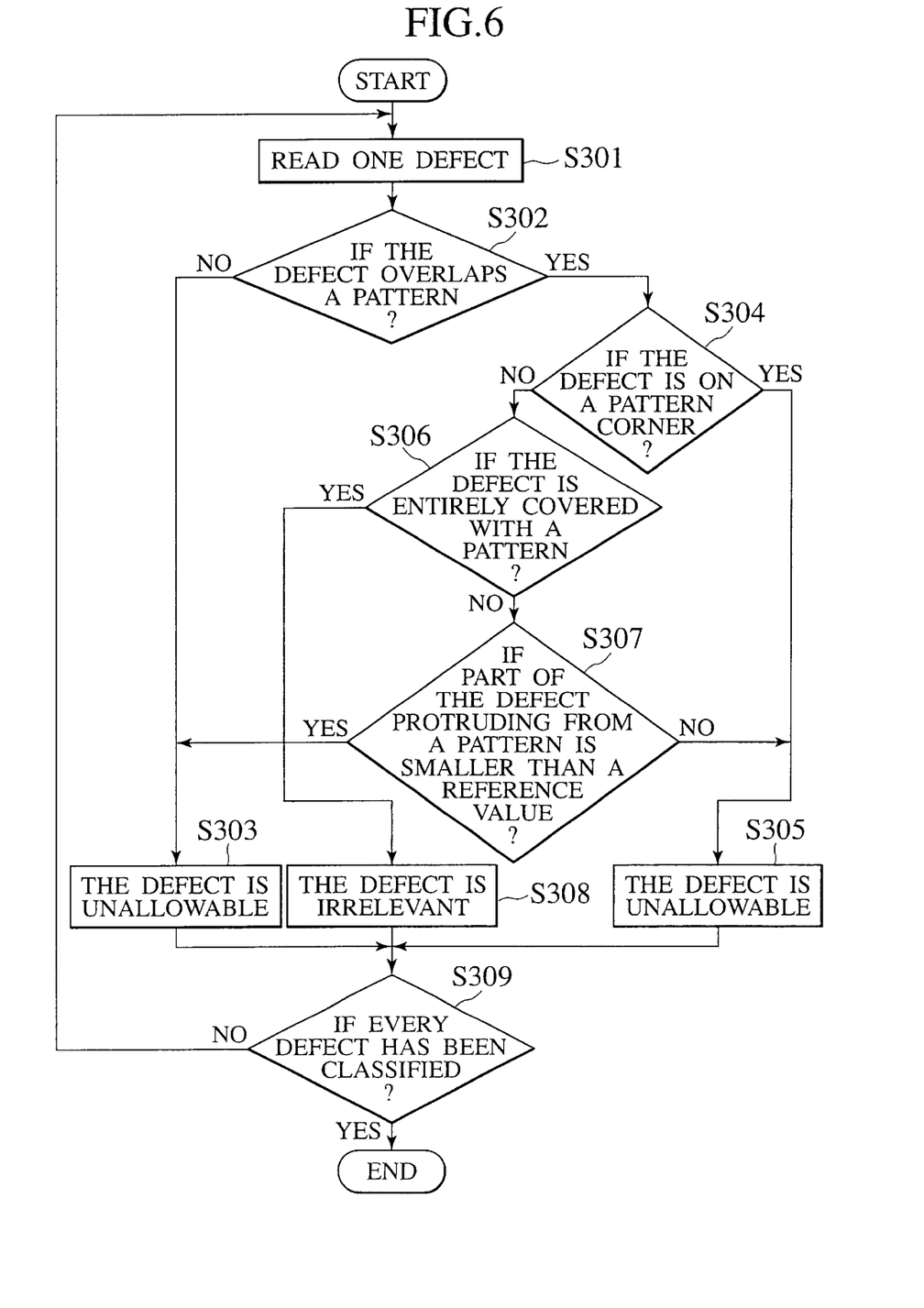
FIG. 6 is a flowchart showing a defect classifying flow according to an embodiment of the present invention.

FIG. 6 is a flowchart showing a defect classifying flow. Step S301 reads one of the defects. For example, step S301 reads the position and size of one of the defects. According to the positions and sizes of the read defect and patterns 201 in the pattern image generated by the pattern image generator 112, step S302 determines whether or not the read defect overlaps any one of the patterns 201. If the defect is determined not to overlap the patterns 201, step S303 confirms that the defect is allowable. If the defect is determined to overlap the patterns 201, step S304 checks to see if the defect is on a pattern corner. A defect that is on a pattern corner is, for example, the leftmost defect 204 in FIG. 5. If the defect is on a pattern corner, step S305 confirms that the defect is unallowable. If the defect is not on a pattern corner, step S306 checks to see if the defect is entirely covered with a pattern. If the defect is entirely covered with a pattern, step S308 confirms that the defect is irrelevant. In some semiconductor device manufacturing process such as an etching process, a particle (defect) may remain as a pattern. In this case, the defect entirely covered with a pattern is admitted as an irrelevant defect. If the defect is not entirely covered with a pattern in step S306, step S307 checks to see if a part of the defect protruding from a pattern is smaller than a reference value. If the protruding part of the defect is smaller than the reference value, step S303 confirms that the defect is allowable, and if not, step S305 confirms that the defect is unallowable. Step S309 checks to see if every defect has been classified. If there is a defect to be classified, step S301 is repeated, and if all defects have been classified, the flow ends.

A ratio computation unit 118 computes an allowable ratio according to an expression (3) and an unallowable ratio according to an expression (4). The computed ratios are stored in a ratio database 119.

$$\text{Allowable ratio} = 1 - \text{unallowable ratio} \quad (3)$$

$$\text{Unallowable ratio} = \text{the number of unallowable defects}/(\text{the number of generated defects} - \text{the number of irrelevant defects}) \quad (4)$$

One or both of the allowable ratio and unallowable ratio are computed for each particle size. Thereafter, a function generator 120 generates a function expression of a particle size and an allowable ratio. To generate the function expression, a base polynomial may be given. For example, a polynomial of degree one is given as $Y=a*X+b$, or a polynomial of degree two is given as $Y=a*X^2+b*X+c$, where Y is an unallowable ratio and X is a particle size. A least square method is employed to find coefficients a, b, and c that most approximate the variables Y and X. Instead of the function expression, a relation table is employable. According to the embodiment, an unallowable ratio is computed first and then a function expression is generated. This does not limit the present invention. For example, it is possible to compute only the unallowable ratio.

Figure 7:
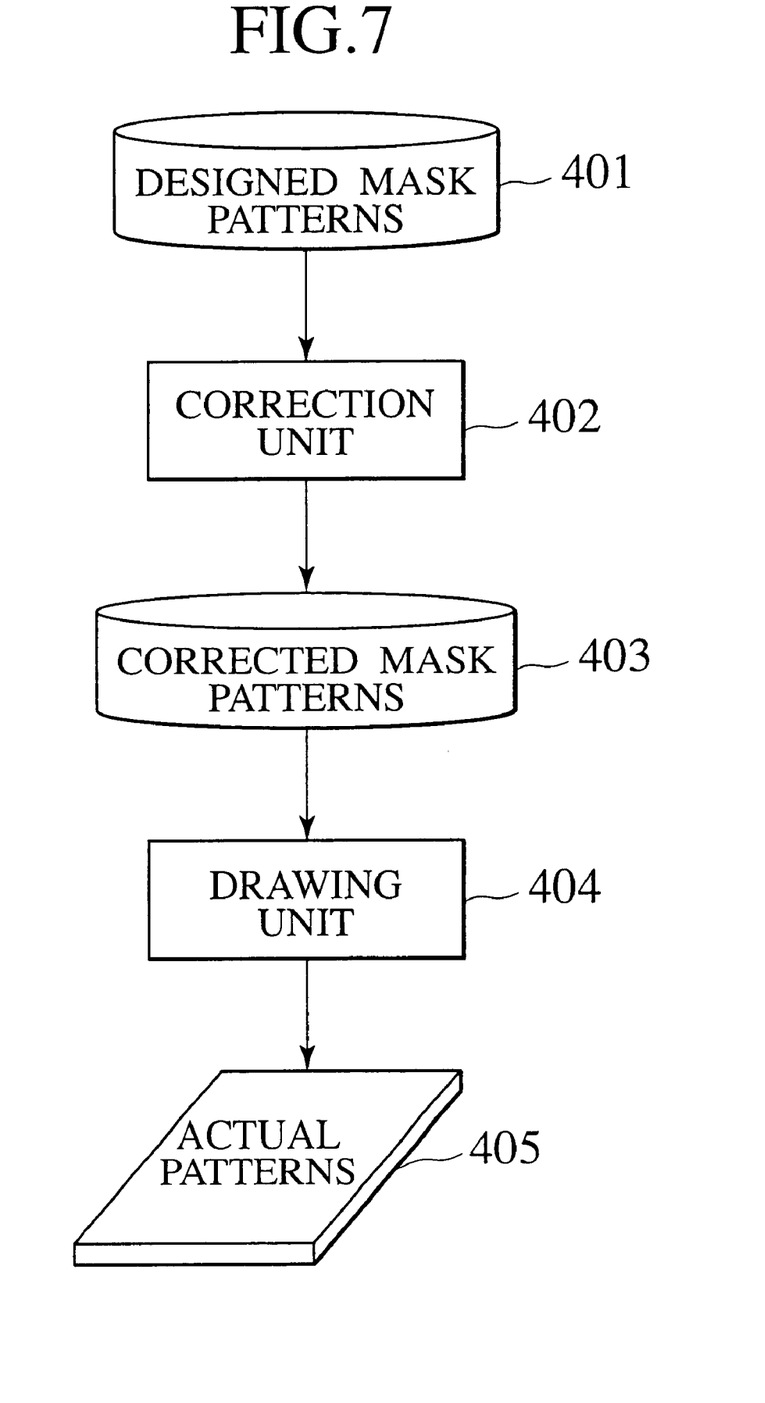
FIG. 7 shows an actual mask pattern forming flow according to an embodiment of the present invention.

The embodiment generates a pattern image of a mask according to CAD data. This does not limit the present invention. For example, it is possible to actually prepare a mask with patterns and generate a pattern image of the mask. FIG. 7 shows a flow of actually forming a mask having patterns. First, patterns 401 are designed for a mask. The designed patterns 401 are corrected by a correction unit 402. Due to, for example, the characteristics of a mask drawing apparatus, the designed patterns may differ from those optically drawn on the mask. For example, the sizes of the optically drawn patterns may differ from those of the designed patterns, or the corners of the optically drawn patterns may be rounded. To correct such trouble, the correction unit 402 corrects the designed patterns and provides corrected patterns 403. According to the corrected patterns 403, a drawing unit 404 draws actual patterns 405. The actual patterns 405 may differ from the designed patterns 401, and therefore, the actual patterns 405 are used to evaluate yield of the mask patterns. This evaluation technique is more accurate.

Figure 8:
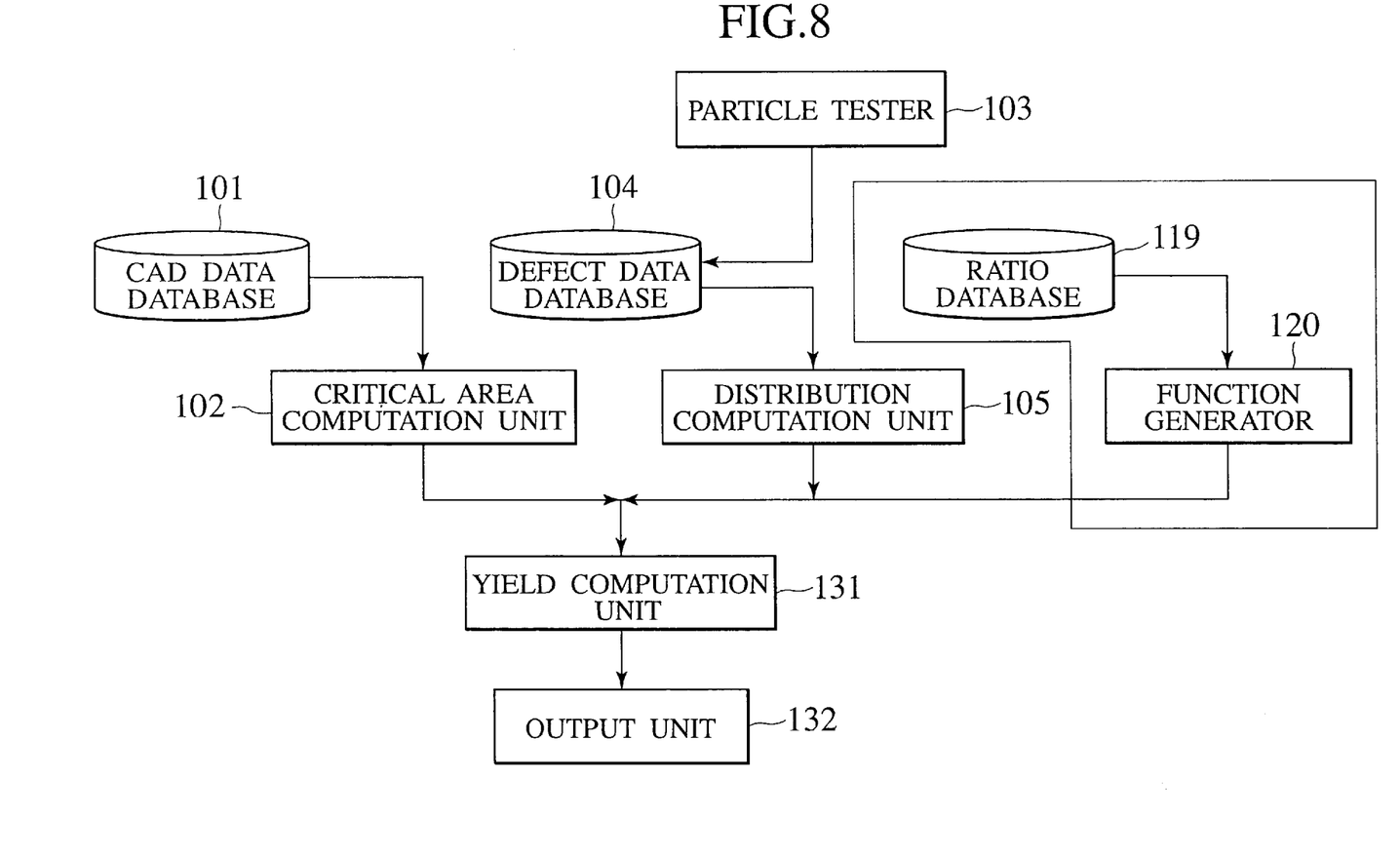
FIG. 8 is a block diagram showing a system for evaluating mask pattern yield according to an embodiment of the present invention.

FIG. 8 is a block diagram showing a system for evaluating mask pattern yield according to an embodiment of the present invention.

A critical area computation unit 102 reads patterns of a given mask from a CAD data database 101 and computes each area where a particle having a given size causes a killer defect. The area where a particle having a given size causes a killer defect is, for example, an area between two patterns that will be connected to each other if the particle is present in the area.

A particle tester 103 collects defect data from a mask manufacturing process and stores the defect data in a defect data database 104. According to the defect data, a distribution computation unit 105 computes a particle size distribution.

A function generator 120 obtains an unallowable ratio computed as mentioned above from a ratio database 119 and computes a function expression for the unallowable ratio.

A yield computation unit 131 computes yield as follows:

$$Y=exp(-\lambda) \quad (1)$$

where Y is the yield and $\lambda$ is a killer defect that is expressed as follows:

$$\lambda = \int_{Rmin}^{Rmax} Ac(R) \cdot D(R) \cdot K(R) dR \quad (5)$$

where Ac(R) is a critical area, D(R) is a particle size distribution, K(R) is an unallowable ratio, Rmax is a maximum particle size, and Rmin is a minimum particle size.

An output unit 132 outputs the yield computed by the yield computation unit 131. In this way, the embodiment evaluates patterns on a mask by determining whether or not defects on the mask are allowable. At this time, the embodiment classifies the defects into allowable defects, unallowable defects, and irrelevant defects and correctly evaluates the mask patterns.

A defect that is out of any pattern or a defect whose protruding part from a pattern is smaller than a reference value is classified as an allowable defect. A defect that is on a pattern corner or a defect whose protruding part from a pattern is greater than the reference value is classified as an unallowable defect. A defect that has no influence on any pattern is classified as an irrelevant defect. In some semiconductor device manufacturing process such as an etching process, a defect may remain as a pattern. In this case, a defect entirely covered with a pattern is classified as an irrelevant defect.

After computing an allowable ratio or an unallowable ratio, it may be used to evaluate yield of mask patterns. More precisely, an output of the pattern tester 117 is used to compute an unallowable ratio by subtracting the number of irrelevant defects from the number of generated defects and then by dividing the number of unallowable defects by the difference (unallowable ratio=the number of unallowable defects/(the number of generated defects−the number of irrelevant defects)). The computed unallowable ratio is used to evaluate yield of mask patterns.

As explained above, the system for evaluating mask patterns according to the present invention is capable of correctly evaluating mask patterns, as well as yield of the mask patterns.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A system for evaluating mask patterns, comprising:
   a pattern image generator configured to generate a pattern image of mask patterns to be formed on a mask;
   a defect generator configured to receive defect data for particles and imaginarily generate defects on the mask according to the defect data;
   a pattern-defect image generator configured to generate a pattern-defect image of the mask by combining the generated pattern image with the generated defects;
   a rule database configured to store pattern rules;
   a pattern tester configured to determine whether or not each of the generated defects in the pattern-defect image is allowable according to the pattern rules, the pattern tester configured to classify each of the generated defects into an allowable defect, an unallowable defect, or an irrelevant defect; and
   a ratio computation unit configured to compute at least one of an allowable ratio and an unallowable ratio according to a determination result from the pattern tester.

2. The system as claimed in claim 1, wherein the defect data for particles received by the defect generator includes the sizes and numbers of the particles.

3. The system as claimed in claim 1, further comprising:
   a yield evaluation unit configured to evaluate yield of the mask patterns according to the at least one of an allowable ratio and an un allowable ratio computed by the ratio computation unit.

4. The system as claimed in claim 3, wherein the ratio computation unit computes a relational expression of particle size and at least one of an allowable ratio and an un allowable ratio.

5. The system as claimed in claim 4, wherein the yield evaluation unit comprises: a critical area computation unit configured to compute a critical area where a particle having a given size connects two mask patterns to each other; a distribution computation unit configured to compute a particle size distribution; and a yield computation unit configured to compute yield of the mask patterns according to the computed relational expression of particle size and at least one of an allowable ratio and an un allowable ratio.

6. The system as claimed in claim 1, wherein the pattern image generator generates a pattern image of mask patterns actually formed on the mask.

7. The system as claimed in claim 1, wherein the defect generator receives at least the sizes and numbers of particles and randomly and imaginarily generates defects according to the received particle sizes and numbers.

8. The system as claimed in claim 1, wherein the pattern tester classifies a given defect as:
   the allowable defect if the given defect is out of any one of the mask patterns or if a part of the given defect protruding from any one of the mask patterns is smaller than a reference value;
   the unallowable defect if the given defect is on a pattern corner or if a part of the given defect protruding from any one of the mask patterns is not smaller than the reference value; and
   the irrelevant defect if the given defect has no influence on the mask patterns.

9. The system as claimed in claim 8, wherein the pattern tester classifies the given defect as the irrelevant defect if the given defect is covered with any one of the mask patterns.

10. The system as claimed in claim 8, wherein the ratio computation unit computes, according to the determination result from the pattern tester, an allowable ratio by subtracting the number of irrelevant defects from the number of generated defects and then by dividing the number of allowable defects by the difference (allowable ratio=the number of allowable defects/(the number of generated defects-the number of irrelevant defects)), and/or an unallowable ratio by subtracting the number of irrelevant defects from the number of generated defects and then by dividing the number of unallowable defects by the difference (unallowable ratio=the number of unallowable defects/(the number of generated defects-the number of irrelevant defects)).

11. A method of evaluating mask patterns, comprising:
   generating a pattern image of mask patterns to be formed on a mask, receiving data for particles, imaginarily generating defects on the mask according to the received data, and generating a pattern-defect image of the mask by combining the generated pattern image with the generated defects;
   determining whether or not each of the generated defects in the pattern-defect image is allowable according to pattern rules, including classifying the generated defects into an allowable defect, an unallowable defect, or an irrelevant defect; and computing, according to a result of the determination, at least one of an allowable ratio and an unallowable ratio.

12. The method as claimed in claim 11, wherein receiving data for particles comprises:

receiving at least the sizes and numbers of the particles.

13. The method as claimed in claim 11, further comprising:

evaluating yield of the mask patterns according to the computed at least one of the allowable ratio and unallowable ratio.

14. The method as claimed in claim 13, wherein computing at least one of an allowable ratio and an unallowable ratio comprises:

computing a relational expression of particle size and at least one of the allowable ratio and unallowable ratio.

15. The method as claimed in claim 14, wherein evaluating yield of the mask patterns comprises:

computing a critical area where a particle having a given size connects two mask patterns to each other;

computing a particle size distribution; and computing yield of the mask patterns according to the computed critical areas, the computed particle size distribution, and the computed at least one of the allowable ratio and unallowable ratio.

16. The method as claimed in claim 11, wherein generating a pattern image comprises:

generating a pattern image of mask patterns actually formed on the mask.

17. The method as claimed in claim 11, wherein receiving data for particles and imaginarily generating defects on the mask according to the received data comprise:

receiving at least the sizes and numbers of particles and randomly and imaginarily generating defects according to the received particle sizes and numbers.

18. The method as claimed in claim 11, wherein determining whether or not each of the defects in the pattern-defect image is allowable comprises classifying a given defect as:

the allowable defect if the given defect is out of any one of the mask patterns or if a part of the given defect protruding from any one of the mask patterns is smaller than a reference value;

the unallowable defect if the given defect is on a pattern corner or if a part of the given defect protruding from any one of the mask patterns is not smaller than the reference value; and the irrelevant defect if the given defect has no influence on the mask patterns.

19. The method as claimed in claim 18, wherein determining whether or not each of the defects in the pattern defect image is allowable further comprises classifying the given defect as the irrelevant defect if the given defect is covered with any one of the mask patterns.

20. The method as claimed in claim 18, wherein computing at least one of an allowable ratio and an unallowable ratio comprises:

computing, according to the classified defects, an unallowable ratio by subtracting the number of irrelevant defects from the number of generated defects and then by dividing the number of unallowable defects by the difference (unallowable ratio=the number of unallowable defects/(the number of generated defects-the number of irrelevant defects)); and computing an allowable ratio by subtracting the computed unallowable ratio from 1 (allowable ratio=1−unallowable ratio).

* * * * *